(12) United States Patent
Chen et al.

(10) Patent No.: US 8,357,890 B2
(45) Date of Patent: Jan. 22, 2013

(54) IMAGE SENSOR AND METHOD FOR FABRICATING THE SAME

(75) Inventors: Chi-Chung Chen, Hua-Lien (TW); Wen-Chen Chiang, Miaoli County (TW); Yu-Tsung Lin, Taichung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 609 days.

(21) Appl. No.: 12/615,268

(22) Filed: Nov. 10, 2009

(65) Prior Publication Data

US 2011/0108715 A1 May 12, 2011

(51) Int. Cl.
*G01J 3/50* (2006.01)
*H01L 27/00* (2006.01)
*H01L 31/00* (2006.01)
*H01L 27/146* (2006.01)

(52) U.S. Cl. .................. 250/226; 250/208.1; 250/214.1; 257/435

(58) Field of Classification Search ................ 250/208.1, 250/214.1, 216, 221, 226; 257/292, 735, 257/431–435
See application file for complete search history.

(56) References Cited

U.S. PATENT DOCUMENTS

| 7,180,044 | B2 | 2/2007 | Yu |
| 7,339,155 | B2* | 3/2008 | Lee ............................. 250/214.1 |
| 2004/0147059 | A1* | 7/2004 | Jeong et al. ...................... 438/70 |
| 2006/0113622 | A1 | 6/2006 | Adkisson |
| 2006/0292731 | A1* | 12/2006 | Kim ................. 438/57 |
| 2007/0241418 | A1 | 10/2007 | Wang |
| 2009/0114965 | A1* | 5/2009 | Moon ........................... 257/292 |

* cited by examiner

Primary Examiner — Kevin Pyo
Assistant Examiner — Don Williams
(74) Attorney, Agent, or Firm — Winston Hsu; Scott Margo

(57) ABSTRACT

A method for fabricating image sensor is disclosed. The method includes the steps of: providing a substrate, wherein the substrate comprises a plurality of photodiodes; forming at least one dielectric layer and a passivation layer on surface of the substrate; using a patterned photomask to perform a first pattern transfer process for forming a plurality of trenches corresponding to each photodiode in the passivation layer; forming a plurality of color filters in the trenches; covering a planarizing layer on the color filters; and using the patterned photomask to perform a second pattern transfer process for forming a plurality of microlenses corresponding to each color filter on the planarizing layer.

17 Claims, 4 Drawing Sheets

IMAGE SENSOR AND METHOD FOR FABRICATING THE SAME

BACKGROUND OF THE INVENTION

1. Field of the Invention

The invention relates to a method for fabricating an image sensor, and more particularly, to a method of using the patterned photomask of forming microlenses for fabricating color filters.

2. Description of the Prior Art

As the development of electronic products progresses, the demand for related components has increased as well. For example, as the development of digital cameras and scanners progresses, the demand for image sensor increases accordingly. In general, today's image sensors in common usage are divided into two main categories: charge coupled device (CCD) sensors and CMO image sensors (CIS). The application of CMOS image sensors has increased significantly for several reasons. Primarily, CMOS image sensors have certain advantages of offering low operating voltage, low power consumption, and the ability for random access. Additionally, CMOS image sensors are currently capable of integration with the semiconductor fabrication process.

The CMOS image sensor separates (i.e., classifies) incident light into a combination of light of different wavelengths. The light of different wavelengths is received by respective sensing elements and is subsequently transferred into digital signals of different intensities. For example, the CMOS image sensor can consider incident light as a combination of red, blue, and green light. Those wavelengths are subsequently received by photodiodes, and then transformed into digital signals. However, in order to separate incident light, a monochromatic color filter array (CFA) must be set above every optical sensor element.

Nevertheless, conventional method for fabricating a color filter array typically involves the step of forming the color filters directly on the surface of a passivation layer, and covering a planarizing layer and forming a plurality of microlenses corresponding to the color filters thereafter. As the color filters are formed on the passivation layer, this design not only increases the path of light traveling to the photodiodes in the substrate, but also results in peeling of color filters and affects the performance of the image sensor.

SUMMARY OF THE INVENTION

It is therefore an objective of the present invention to provide a method of fabricating an image sensor for solving the aforementioned problems.

According to a preferred embodiment of the present invention, a method for fabricating image sensor is disclosed. The method includes the steps of: providing a substrate, wherein the substrate comprises a plurality of photodiodes; forming at least one dielectric layer and a passivation layer on surface of the substrate; using a patterned photomask to perform a first pattern transfer process for forming a plurality of trenches corresponding to each photodiode in the passivation layer; forming a plurality of color filters in the trenches; covering a planarizing layer on the color filters; and using the patterned photomask to perform a second pattern transfer process for forming a plurality of microlenses corresponding to each color filter on the planarizing layer.

According to another aspect of the present invention, a method for fabricating image sensor is disclosed. The method includes the steps of: providing a substrate, wherein the substrate comprises a plurality of photodiodes; forming at least one dielectric layer and a passivation layer on surface of the substrate; using a patterned photomask to perform a first pattern transfer process for forming a plurality of trenches in the passivation layer; filling a light shielding material in the trenches for forming a plurality of patterned light shielding layers; forming a plurality of color filters on surface of the patterned light shielding layers and the passivation layer; covering a planarizing layer on the color filters; and using the patterned photomask to perform a second pattern transfer process for forming a plurality of microlenses corresponding to each color filter on the planarizing layer.

According to another aspect of the present invention, an image sensor is disclosed. The image sensor preferably includes: a substrate; a plurality of photodiodes disposed in the substrate; at least one dielectric layer covering the substrate and the photodiodes; a passivation layer disposed on surface of the dielectric layer; a plurality of patterned light shielding layers disposed in the passivation layer; a plurality of color filters disposed on surface of the passivation layer and the patterned light shielding layers; a planarizing layer disposed on the color filters; and a plurality of microlenses disposed on surface of the planarizing layer corresponding to each color filter, wherein each microlens not overlapping each patterned light shielding layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
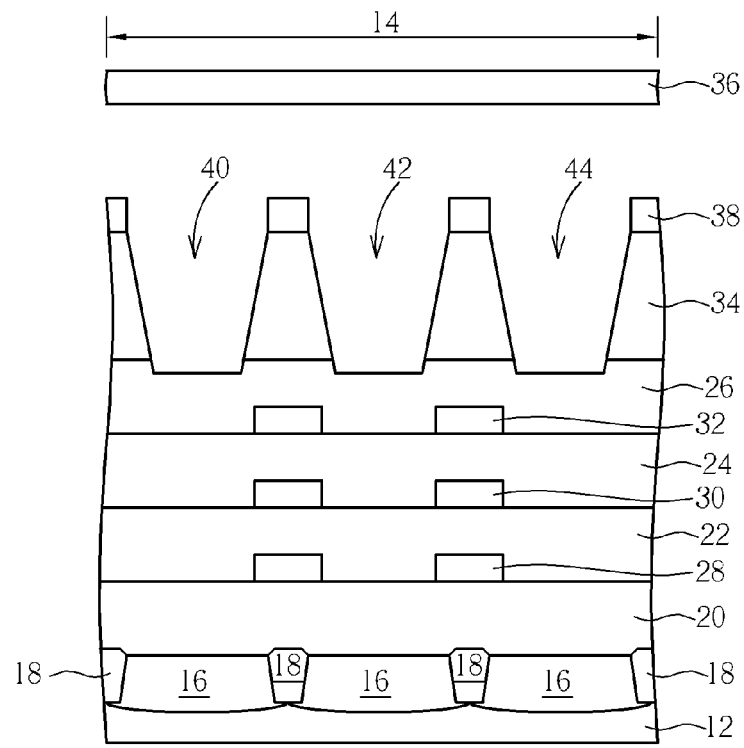
FIGS. 1-2 illustrate a method for fabricating an image sensor according to a first embodiment of the present invention.
Figure 2:
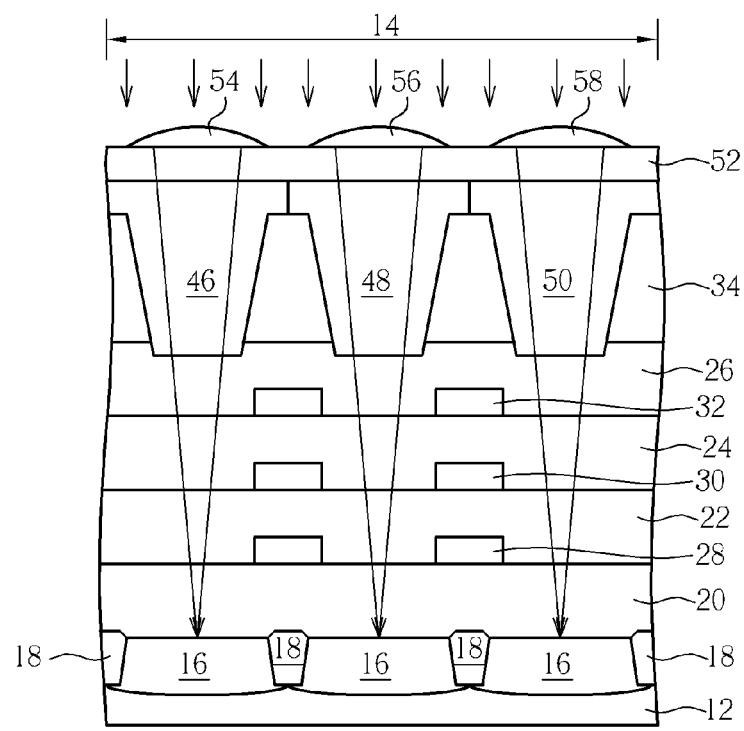

Referring to FIGS. 1-2, FIGS. 1-2 illustrate a method for fabricating an image sensor according to a first embodiment of the present invention. As shown in the figures, a substrate 12, such as a silicon substrate is provided, in which a sensor array region 14 is defined on the substrate 12. A plurality of photodiodes 16 used for collecting light, a plurality of CMOS transistors, and a plurality of shallow trench isolations (STI) 18 surrounding the photodiodes 16 are formed in the substrate 12.

An interlayer dielectric layer 20 is deposited on the substrate 12 to cover the complimentary metal-oxide semiconductor (CMOS) transistors and the photodiodes 16, and a metal interconnective process is performed to form a plurality of dielectric layers 22/24/26 on the interlayer dielectric layer 20 and a plurality of patterned metal layers 28/30/32 in each of the dielectric layers 22/24/26. The patterned metal layers 28//30/32 are preferably used as metal interconnects of the image sensor as well as for blocking scattered lights. Despite only three dielectric layers 22/24/26 are disclosed in this embodiment, the number and quantity of the dielectric layers 22/24/26 and patterned metal layers 28/30/32 could be adjusted according to the demand of the product and not limited thereto.

A passivation layer 34 composed of silicon nitrides or silicon oxides is then deposited on the top dielectric layer 26, and a patterned transfer process is conducted by aligning the pattern of a patterned photomask 36 to an alignment mark (not shown) on the substrate 12 and transfer the pattern of this patterned photomask 36 to a negative type photoresist 38. The negative type patterned photoresist 38 is used as a mask to perform an etching process on the passivation layer 34 and the dielectric layer 26, which preferably forms a plurality of trenches 40/42/44 corresponding to each photodiode 16 in the passivation layer 34 and a portion of the dielectric layer 26.

Next, as shown in FIG. 2, after stripping the patterned photoresist 38, a plurality of color filters 46/48/50 are formed in the trenches 40/42/44 while covering a portion of the passivation layer 34 surface. For instance, a blue color filter material (not shown) is deposited in the trenches 40/42/44 and on top of the passivation layer, and an exposure and development process is performed to form a blue color filter 46 in the trench 40 while removing blue color filter material from the trenches 42/44. Next, green and red color filter material are deposited in the remaining trenches and aforementioned exposure and development processes are repeated to form a green color filter 48 in the trench 42 and a red color filter 50 in the trench 44. Despite the color filters are exemplified with blue, green and red colors, the color and arrangement of color filters are not limited to this combination. For instance, the color filters could also be selected from cyan color filter, magenta color filter, and yellow color filter, and combination of more than three colors could also be incorporated into the color filter array of the present invention.

A planarizing layer 52 is formed on surface of the blue color filter 46, green color filter 48, and red color filter 50, and a plurality of microlenses 54/56/58 corresponding to each color filter is formed on the planarizing layer 52. Preferably, the fabrication of the microlenses is conducted by first forming a polymer layer (not shown) composed of acrylate material on the planarizing layer 52, using the same photomask 36 and alignment mark used for forming the trenches 40/42/44 to perform an exposure and development process on the polymer layer, and performing a reflow process to form a plurality of microlenses 54/56/58 corresponding to the color filters 46/48/50 on the planarizing layer 52.

It should be noted by using the same patterned photomask and alignment mark for forming the trenches 40/42/44 and the microlenses 54/56/58, upon completing the formation of the microlenses 54/56/58, the microlenses 54/56/58 are automatically aligned with each of the color filters 46/48/50. Moreover, by forming a plurality of trenches in the passivation layer and a portion of the dielectric layer and depositing color filters in the trenches thereafter, the present invention could reduce the path for light traveling to the photodiodes substantially and also resolve the peeling issue of color filters from the surface of the passivation layer.

Figure 3:
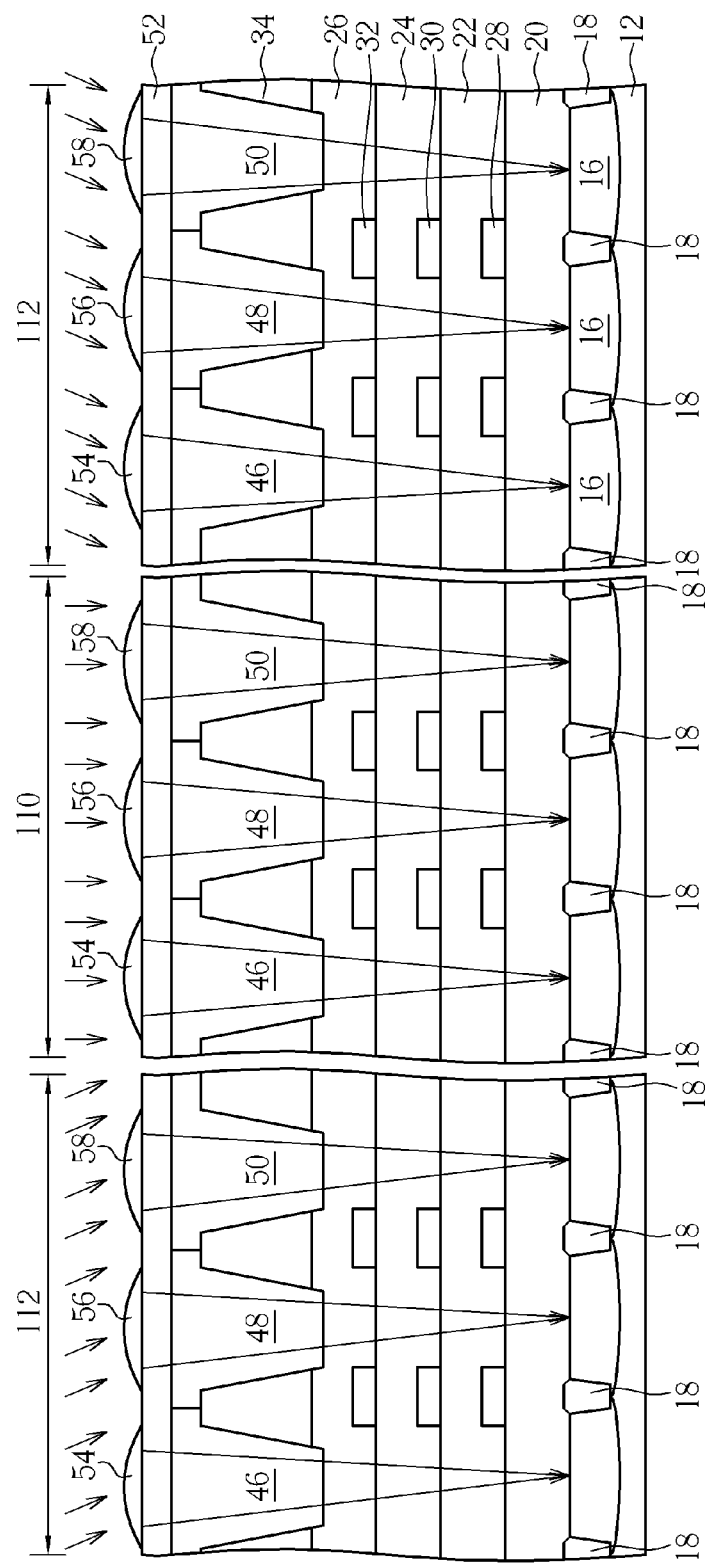
FIG. 3 illustrates a structural view of applying the fabrication process from the first embodiment to the peripheral region of a sensory array region.

It should also be noted that the embodiment disclosed in FIG. 2 specifically pertains to a structure located in the central region of the sensor array region 14. However, the aforementioned process could also be combined with program shift of the microlenses and applied in the periphery of the sensor array region 14, which is also within the scope of the present invention. As shown in FIG. 3, the process of forming trenches in the passivation layer and depositing color filters in the trenches could be applied to the central region 110 and peripheral region 112 of the sensory array region 14. Due to shift of lights, a program shift is typically conducted on the microlenses disposed in the peripheral region 112 to compensate such shift. Similar to the aforementioned embodiment, the same photomask and alignment mark are utilized to complete the process for etching trenches for the color filters and forming of the microlenses. By doing so, the microlenses 54/56/58 undergone the program shift are aligned automatically with the color filters 46/48/50 underneath.

Figure 4:
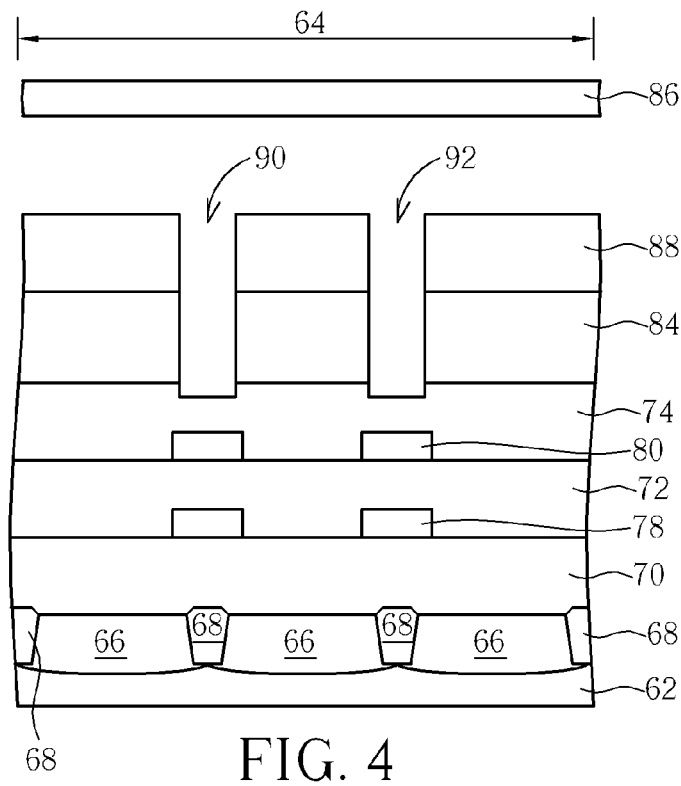
FIGS. 4-5 illustrate a method for fabricating an image sensor according to a second embodiment of the present invention.
Figure 5:
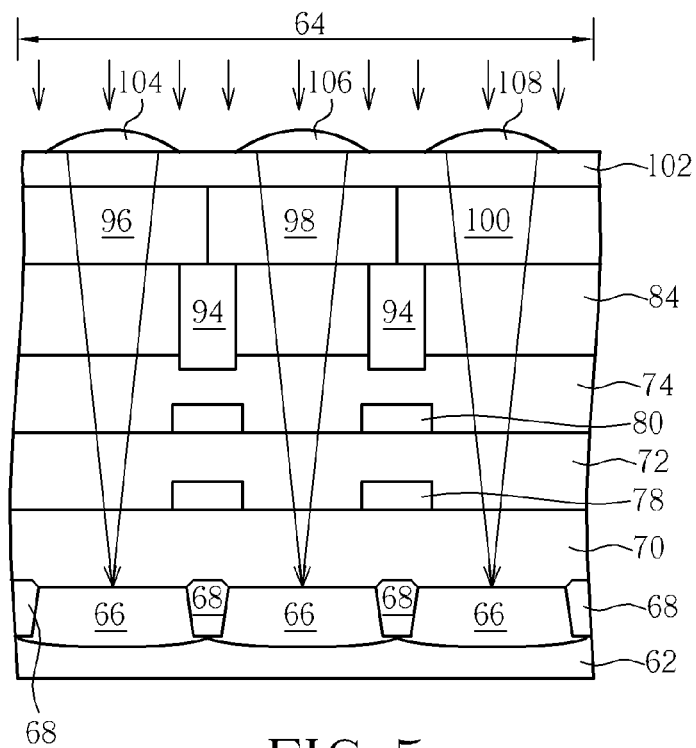

Referring to FIGS. 4-5, FIGS. 4-5 illustrate a method for fabricating an image sensor according to a second embodiment of the present invention. As shown in the figures, a substrate 62, such as a silicon substrate is provided, in which a sensor array region 64 is defined on the substrate 62. A plurality of photodiodes 66 used for collecting light, a plurality of CMOS transistors, and a plurality of shallow trench isolations (STI) 68 surrounding the photodiodes 66 are formed in the substrate 62.

An interlayer dielectric layer 70 is deposited on the substrate 62 to cover the CMOS transistors and the photodiodes 66, and a metal interconnective process is performed to form a plurality of dielectric layers 72/74 on the interlayer dielectric layer 70 and a plurality of patterned metal layers 78/80 in each of the dielectric layers 72/74. The patterned metal layers 78/80 are preferably used as metal interconnects of the image sensor as well as for blocking scattered lights. Despite only two dielectric layers 72/74 are disclosed in this embodiment, the number and quantity of the dielectric layers 72/74 and patterned metal layers 78/80 could be adjusted according to the demand of the product and not limited thereto.

A passivation layer 84 composed of silicon nitrides or silicon oxides is then deposited on the top dielectric layer 74, and a patterned transfer process is conducted by aligning the pattern of a patterned photomask 86 to an alignment mark (not shown) on the substrate 62 and transfer the pattern of this patterned photomask 86 to a positive type photoresist 88. The positive type patterned photoresist 88 is used as a mask to perform an etching process on the passivation layer 84 and the dielectric layer 74, which preferably forms a plurality of trenches 90/92 not covering each photodiode 66 in the passivation layer 84 and a portion of the dielectric layer 74. The trenches 90/92 are also formed corresponding to the shallot trench isolations 68 disposed around the photodiodes 66.

Next, as shown in FIG. 5, after stripping the patterned photoresist 88, a plurality of patterned light shielding layers 94 composed of light shielding materials are formed in the trenches 90/92. In this embodiment, the patterned light shielding layers 94 are preferably composed of black photoresist material. However, the patterned light shielding layer 94 could also be composed of metal, such as tungsten. If the patterned light shielding layer 94 is composed of photoresist material, a plasma treatment could be conducted to remove a portion of the photoresist material from the surface of the passivation layer 84 after the photoresist is deposited in the trenches 90/92, whereas if the patterned light shielding layer 94 is composed of metal, a chemical mechanical polishing (CMP) process could be carried out to planarize the deposited light shielding metal, such that the light shielding material deposited in the trenches 90/92 are even with the surface of the passivation layer 84.

Next, a color filter array fabrication process is conducted by using the same photomask 86 and alignment mark used for forming the trenches 90/92 to form a color filter array composed of blue color filter 96, green color filter 98, and red color filter 100 on the surface of the planarized patterned light shielding layers 94 and the passivation layer 84. Despite the color filters in this embodiment are exemplified with blue, green and red colors, the color and arrangement of color filters are not limited to this combination. For instance, the color filters could also be selected from cyan color filter, magenta color filter, and yellow color filter, and combination of color arrangement with more than three colors could also be incorporated into the color filter array of the present invention.

A planarizing layer 102 is formed on surface of the color filters 96/98/100, and a plurality of microlenses 104/106/108 corresponding to each color filter is formed on the planarizing layer 102. Preferably, the fabrication of the microlenses 104/106/108 is conducted by first forming a polymer layer (not shown) composed of acrylate material on the planarizing layer 102, using the same photomask 86 and alignment mark used for forming the trenches 90/92 to perform an exposure and development process on the polymer layer, and performing a reflow process to form a plurality of microlenses 104/106/108 corresponding to the color filters 96/98/100 on the planarizing layer 102.

In contrast to the first embodiment, this embodiment preferably uses the same patterned photomask to form the trenches 90/92 for the patterned light shielding layer 94 and the microlenses 104/106/108 thereafter. By using the positive type photoresist 88 for forming the trenches 90/92, the edge of the microlenses 104/106/108 fabricated preferably not overlapping the edge of the patterned light shielding layer 94.

Hence, an image sensor structure is further disclosed from the aforementioned FIG. 5. As shown in the figure, the image sensor preferably includes: a substrate 62; a plurality of photodiodes 66 disposed in the substrate 62; an interlayer dielectric layer 70 disposed on the substrate 62 and the photodiodes 66; a plurality of dielectric layers 72/74 disposed on the interlayer dielectric layer 70; a plurality of patterned metal layer 78/80 disposed in the dielectric layers 72/74; a passivation layer 84 disposed on surface of the dielectric layers 72/74; a plurality of patterned light shielding layers 94 disposed in the passivation layer 84 and a portion of the dielectric layer 74; a plurality of color filters 96/98/100 disposed on surface of the passivation layer 84 and the patterned light shielding layers 94; a planarizing layer 102 disposed on the color filters 96/98/100; and a plurality of microlenses 104/106/108 disposed on surface of the planarizing layer 102 corresponding to each color filter 96/98/100.

In this embodiment, the edge of each microlens 104/106/108 preferably not overlapping the edge of each patterned light shielding layer 94. Moreover, the color filters 96/98/100 could be selected from red color filter, green color filter, blue color filter, cyan color filter, magenta color filter, and yellow color filter, and the patterned light shielding layer 94 could be selected from black photoresist or metal such as tungsten.

Figure 6:
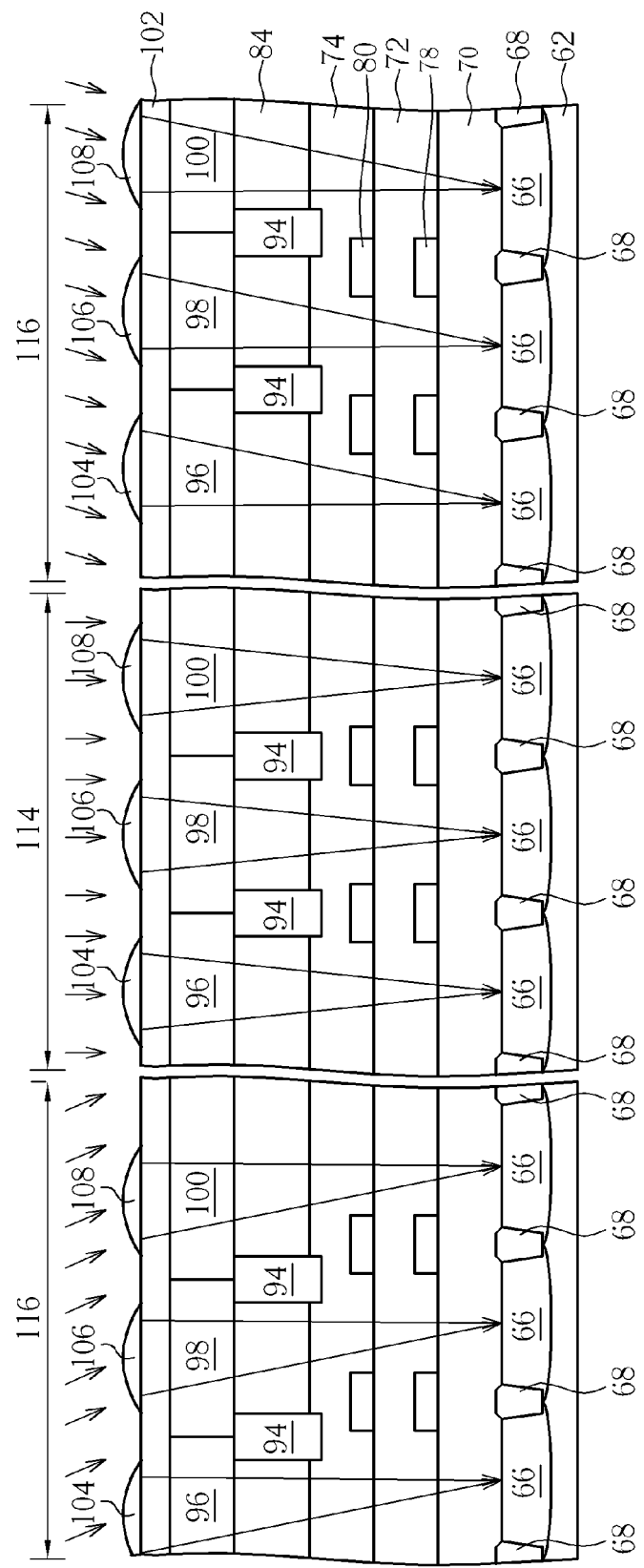
FIG. 6 illustrates a structural view of applying the fabrication process from the second embodiment to the peripheral region of a sensory array region.

It should be noted that the embodiment disclosed in FIG. 5 specifically pertains to a structure located in the central region of the sensor array region 64. However, the aforementioned process shown in FIGS. 4-5 could also be applied to the periphery of the sensor array region 64, which is also within the scope of the present invention. As shown in FIG. 6, the process of forming patterned shielding layers 94 in the passivation layer 84 and forming color filter arrays thereon could be applied to the central region 114 and peripheral region 116 of the sensory array region 64. As shown in the figure presented, despite the microlenses 104/106/108 in the peripheral region 116 of the sensory array region 64 are slightly shifted from the photodiodes 66 due to program shift, the edge of the microlenses 104/106/108 is preferably not overlapping any of the patterned shielding layer 94 as the same photomask and alignment mark were used to form the patterned shielding layer 94 and the microlenses 104/106/108.

Those skilled in the art will readily observe that numerous modifications and alterations of the device and method may be made while retaining the teachings of the invention.

What is claimed is:

1. A method for fabricating image sensor, comprising:
   providing a substrate, wherein the substrate comprises a plurality of photodiodes;
   forming at least one dielectric layer and a passivation layer on surface of the substrate;
   using a patterned photomask to perform a first pattern transfer process for forming a plurality of trenches corresponding to each photodiode in the passivation layer;
   forming a plurality of color filters in the trenches, wherein each of the color filters covers a portion of a top surface of the passivation layer;
   covering a planarizing layer on the color filters; and
   using the patterned photomask to perform a second pattern transfer process for forming a plurality of microlenses corresponding to each color filter on the planarizing layer.

2. The method of claim 1, wherein the color filters are selected from red color filter, green color filter, blue color filter, cyan color filter, magenta color filter, and yellow color filter.

3. The method of claim 1, wherein the first pattern transfer process comprises:
   forming a patterned photoresist on surface of the passivation layer;
   transferring the pattern of the patterned photomask to the patterned photoresist; and
   using the patterned photoresist as a mask to perform an etching process on the passivation layer for forming the trenches.

4. The method of claim 3, wherein the patterned photoresist comprises a negative type photoresist.

5. The method of claim 1, wherein the second pattern transfer process comprises:
   forming a polymer layer on the planarizing layer;
   using the patterned photomask to perform an exposure and development process on the polymer layer; and
   performing a reflow process for forming the microlenses.

6. The method of claim 1, further comprising forming the color filters in the trenches and covering a portion of the passivation layer surface after performing the first pattern transfer process.

7. A method for fabricating image sensor, comprising:
   providing a substrate, wherein the substrate comprises a plurality of photodiodes;
   forming at least one dielectric layer and a passivation layer on surface of the substrate;
   using a patterned photomask to perform a first pattern transfer process for forming a plurality of trenches in the passivation layer and in a portion of the dielectric layer;
   filling a light shielding material in the trenches for forming a plurality of patterned light shielding layers;
   forming a plurality of color filters on surface of the patterned light shielding layers and the passivation layer;
   covering a planarizing layer on the color filters; and
   using the patterned photomask to perform a second pattern transfer process for forming a plurality of microlenses corresponding to each color filter on the planarizing layer.

8. The method of claim 7, wherein the color filters are selected from red color filter, green color filter, blue color filter, cyan color filter, magenta color filter, and yellow color filter.

9. The method of claim 7, wherein the first pattern transfer process comprises:
- forming a pattern photoresist on surface of the passivation layer;
- transferring the pattern of the patterned photomask to the patterned photoresist; and
- using the patterned photoresist as mask to perform an etching process on the passivation layer for forming the trenches.

10. The method of claim 9, wherein the patterned photoresist comprises a positive type photoresist.

11. The method of claim 7, wherein the second pattern transfer process comprises:
- forming a polymer layer on the planarizing layer;
- using the patterned photomask to perform an exposure and development process on the polymer layer; and
- performing a reflow process for forming the microlenses.

12. The method of claim 7, wherein before forming the color filters further comprises using plasma to remove a portion of the light shielding material from the surface of the passivation layer for forming the patterned light shielding layers, such that the patterned light shielding layers are even with the surface of the passivation layer.

13. An image sensor, comprising:
- a substrate;
- a plurality of photodiodes disposed in the substrate;
- at least one dielectric layer covering the substrate and the photodiodes;
- a passivation layer disposed on surface of the dielectric layer;
- a plurality of patterned light shielding layers disposed in the passivation layer and in a portion of the dielectric layer;
- a plurality of color filters disposed on surface of the passivation layer and the patterned light shielding layers;
- a planarizing layer disposed on the color filters; and
- a plurality of microlenses disposed on surface of the planarizing layer corresponding to each color filter, wherein each microlens not overlapping each patterned light shielding layer.

14. The image sensor of claim 13, further comprising a plurality of patterned metal layers disposed in the dielectric layer.

15. The image sensor of claim 13, wherein the color filters are selected from red color filter, green color filter, blue color filter, cyan color filter, magenta color filter, and yellow color filter.

16. The image sensor of claim 13, wherein the patterned light shielding layers comprise black photoresist.

17. The image sensor of claim 13, wherein the patterned light shielding layer comprise tungsten.

* * * * *